US009739649B2

(12) United States Patent
Drescher

(10) Patent No.: US 9,739,649 B2
(45) Date of Patent: Aug. 22, 2017

(54) METHOD FOR INCREASING THE RELIABILITY OF TRANSDUCERS

(71) Applicant: Micronas GmbH, Freiburg (DE)

(72) Inventor: Michael Drescher, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 264 days.

(21) Appl. No.: 14/824,756

(22) Filed: Aug. 12, 2015

(65) Prior Publication Data

US 2016/0047680 A1 Feb. 18, 2016

(30) Foreign Application Priority Data

Aug. 12, 2014 (DE) ........................ 10 2014 011 783

(51) Int. Cl.

| | |
|---|---|
| ***G01R 31/319*** | (2006.01) |
| ***G01R 31/28*** | (2006.01) |
| ***G01D 18/00*** | (2006.01) |
| ***G01D 5/244*** | (2006.01) |
| ***G01D 21/02*** | (2006.01) |
| ***G01D 3/08*** | (2006.01) |
| *G01D 11/24* | (2006.01) |

(52) U.S. Cl.

CPC ............... *G01D 18/00* (2013.01); *G01D 3/08* (2013.01); *G01D 5/24461* (2013.01); *G01D 21/02* (2013.01); *G01R 31/2829* (2013.01); *G01D 11/24* (2013.01); *G01R 31/2851* (2013.01); *G01R 31/31926* (2013.01)

(58) Field of Classification Search

USPC .................. 702/58, 104; 324/762.01, 762.02
See application file for complete search history.

(56) References Cited

U.S. PATENT DOCUMENTS

| | | | |
|---|---|---|---|
| 8,577,634 B2 | 11/2013 | Donovan et al. | |
| 8,805,638 B2 | 8/2014 | Morath | |
| 2014/0366614 A1* | 12/2014 | Knittel | G01D 21/02 73/114.33 |
| 2015/0270994 A1* | 9/2015 | Scherr | H04L 25/4902 375/238 |

FOREIGN PATENT DOCUMENTS

| | | |
|---|---|---|
| DE | 20 2009 017 430 U1 | 5/2011 |
| DE | 10 2011 075 679 A1 | 11/2012 |
| DE | 10 2011 08 902 A1 | 6/2013 |
| EP | 2 233 889 A1 | 9/2010 |
| WO | WO 2012/082207 A1 | 6/2012 |

* cited by examiner

*Primary Examiner* — Gregory J Toatley
*Assistant Examiner* — Terence Stifter, Jr.
(74) *Attorney, Agent, or Firm* — Muncy, Geissler, Olds & Lowe, P.C.

(57) ABSTRACT

A method for increasing a reliability of a transducer is provided. The transducer has a first and a second IC, wherein the two ICs each have substantially the same monolithically integrated circuit components with one sensor apiece, and a signal contact for bidirectional data transmission. A reference contact on each of the two ICs is connected to or disconnected from the signal contact by a controllable switch, and a signal generated as a function of the physical quantity sensed by the relevant sensor is applied to the signal contact. The two ICs are integrated into a common IC package, and a supply voltage contact of the first IC is connected to a first package contact, and the first package contact is connected to a first terminal of a control unit, and the supply voltage contact of the second IC is connected to a second package contact.

12 Claims, 2 Drawing Sheets

METHOD FOR INCREASING THE RELIABILITY OF TRANSDUCERS

This nonprovisional application claims priority to German Patent Application No. 10 2014 011 783.9, filed Aug. 12, 2014, all of which is herein incorporated by reference.

BACKGROUND OF THE INVENTION

Field of the Invention

The invention relates to a method for increasing the reliability of transducers.

Description of the Background Art

A sensor housing having two sensors and a first integrated circuit and a second integrated circuit is known from DE 20 2009 017 430 U1, which corresponds to U.S. Pat. No. 8,805,638. Furthermore, an arrangement with two sensors is known from DE 10 2011 075 679 A1. In addition, the two documents each disclose a method for increasing the reliability of transducers, in particular of sensors. Known from WO 2012/082207 A1, which corresponds to U.S. Pat. No. 8,577,634, is a method for transmitting data between a control unit and a sensor IC by means of the Single Edge Nibble Transmission (SENT) protocol. Among other things, the protocol requires a certain configuration in the interconnection between the control unit and the sensor IC.

SUMMARY OF THE INVENTION

It is therefore an object of the invention to provide a method for increasing the reliability of transducers that advances the state of the art.

According to an exemplary embodiment of the invention, a method for increasing the reliability of transducers is provided, having a first IC and a second IC, wherein the two ICs can have monolithically integrated circuit components each with one sensor and a signal contact designed for bidirectional data transmission and a reference contact and a supply voltage contact, and the reference contact on each of the two ICs is connected to or disconnected from the signal contact by means of a controllable switch, and a signal generated as a function of the physical quantity sensed by the relevant sensor is applied in each case to the signal contact, and the two ICs are integrated into a common IC package, and the supply voltage contact of the first IC is connected to a first package contact, and the first package contact is connected to a first terminal of a control unit, and the supply voltage contact of the second IC is connected to a second package contact, and the second package contact is connected to a second terminal of the control unit, and the reference contact of the first IC is connected to a third package contact and to the reference contact of the second IC, and the signal contact of the first IC is connected to the signal contact of the second IC and to a fourth package contact, and wherein the two sensor signals are transmitted through the fourth package contact to the control unit, and the two signals are analyzed in the control unit. It should be noted that the sensors can in particular be implemented as magnetic field sensors and/or temperature sensors and/or pressure sensors. The signals determined as a function of the type of the sensor are applied to the signal contacts. The same circuit components can be implemented and monolithically integrated in both ICs.

The two signals can be transmitted to the control unit separately in time. Also, the two sensor signals can be compared via the control unit, and influence the ICs to be carried out as a result of the comparison via the control unit. In particular, it is possible to switch off the faulty IC via the control unit and the separate supply voltage lines, which is to say that only signals from one IC are transmitted over the fourth package contact.

An advantage of the method according to the invention is that two separate sensor signals can be communicated on one signal line instead of a single sensor signal, with no change in the number of signal lines. As a result, a redundancy is created in an advantageous manner. Especially in a Single Edge Nibble Transmission configuration, which is to say a SENT configuration, it is now possible according to the invention to replace an IC package that hitherto had only one single IC in the IC package with an IC package having two ICs. In particular, the reliability in monitoring the physical parameter is significantly increased by the comparison of the sensor signals in the control unit. If one IC in the IC package fails, a cost-intensive and complex intervention in an existing assembly can be reduced. Such assemblies are installed primarily in motor vehicles, for example for detecting the temperature of the engine or for detecting the angular displacement of the camshaft for a start/stop system.

In an embodiment, the two ICs can be controlled as a function of the analysis. It is advantageous when the control is carried out via the control unit. Since the two ICs have separate supply voltage lines, the faulty IC can be switched off easily, without any need to replace the IC package with both ICs.

In an embodiment, in the first IC and in the second IC each signal can be generated as a pulse-width modulated signal via an open-drain output.

The two ICs can be configured within the IC package in a type of master/slave arrangement, whereby the first IC is given priority over the second IC. In particular, the data obtained by means of the sensor of the first IC is transmitted first. In an embodiment, for example, a deviation of the signal of the first IC from the signal of the second IC can be indicated at the signal contact of the second IC.

In an embodiment, only the signal of the second IC is output at the third package contact if the first IC is faulty. In other words, a so-called "fail-over" process is carried out.

In an embodiment, the two ICs can be connected in a SENT compliant configuration. In particular, in an embodiment here, signals from the first IC can be transmitted in a first part of the SENT protocol, and signals from the second IC can be transmitted in a second part of the SENT protocol. In an embodiment, signals from the first IC can be transmitted in the first part of the SENT protocol, and a deviation between the signals can be transmitted with the signal in a second part of the SENT protocol by means of the second IC. In an embodiment, the second IC can be triggered by the first IC and transmits a SENT protocol signal of its own.

The Hall effect sensors can be implemented in the two ICs and the signals can each be generated as a function of the Hall voltage in the two ICs and applied to the signal contact of the relevant IC. It should be noted that the signals can contain, e.g., location information. The location information can contain angle information from a transmitter, for example.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
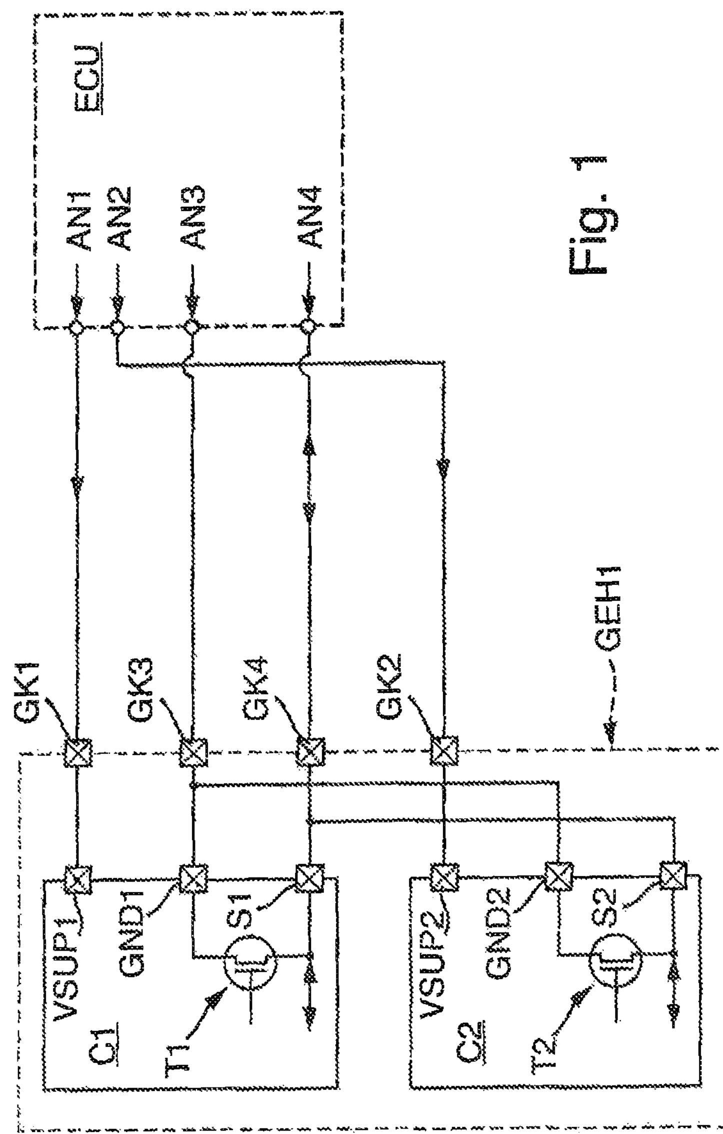
FIG. 1 shows a circuit for carrying out the method according to an exemplary embodiment of the invention.

The illustration in FIG. 1 shows a circuit for carrying out the method according to the invention with a first IC C1 and a second IC C2, wherein the two ICs C1, C2 have the same monolithically integrated circuit components with one sensor apiece—not shown. The two sensors can be implemented as magnetic field sensors, in particular as Hall effect sensors. The two ICs C1, C2 are integrated into a common IC package GEH1. The first IC C1 has a signal contact S1 designed for bidirectional data transmission, and the second IC C2 has a signal contact S2 designed for bidirectional data transmission. The first IC C1 has a reference contact GND1 and a supply voltage contact VSUP1. The second IC C2 has a reference contact GND2 and a supply voltage contact VSUP2. In each of the two ICs C1, C2, the applicable reference contact GND1 or GND2 is connected to the applicable signal contact S1, S2 by means of a controllable switch T1, T2. By means of a triggering at the control input, the applicable signal contact S1, S2 can be short-circuited to the applicable reference contact GND1 or GND2, and in this way generate so-called "open-drain" modulated signals SIG1, SIG2 at the signal contacts S1, S2.

The signal SIG1, SIG2 generated as a function of the physical quantity sensed by the applicable sensor is present at the applicable signal contact S1, S2. It is advantageous for each of the two signals to be pulse-width modulated. The supply voltage contact VSUP1 of the first IC C1 is connected to a first package contact GK1, and the first package contact GK1 is connected to a first terminal AN1 of a control unit ECU. The supply voltage contact VSUP2 of the second IC C2 is connected to a second package contact GK2, and the second package contact GK2 is connected to a second terminal AN2 of the control unit ECU. The reference contact GND1 of the first IC C1 is connected to a third package contact GK3 and to the reference contact GND2 of the second IC C2. The third package contact GK3 is connected to a third terminal AN3 of the control unit ECU. In an embodiment that is not shown, the two reference contacts GND1 and GND2 can also be connected outside of the IC package. An additional package contact is required for this purpose, however. The same also applies for the two signal terminals VSUP1 and VSUP2. Here, too, the two signal terminals can be joined outside of the IC package.

The signal contact SK1 of the first IC C1 is connected to the signal contact SK2 of the second IC C2 and to a fourth package contact GK4. The fourth package contact GK4 is connected to a fourth terminal AN4 of the control unit ECU. The two signals SIG1, SIG2 are transmitted to the control unit ECU through the fourth package contact GK4, and are analyzed in the control unit ECU.

Figure 2:
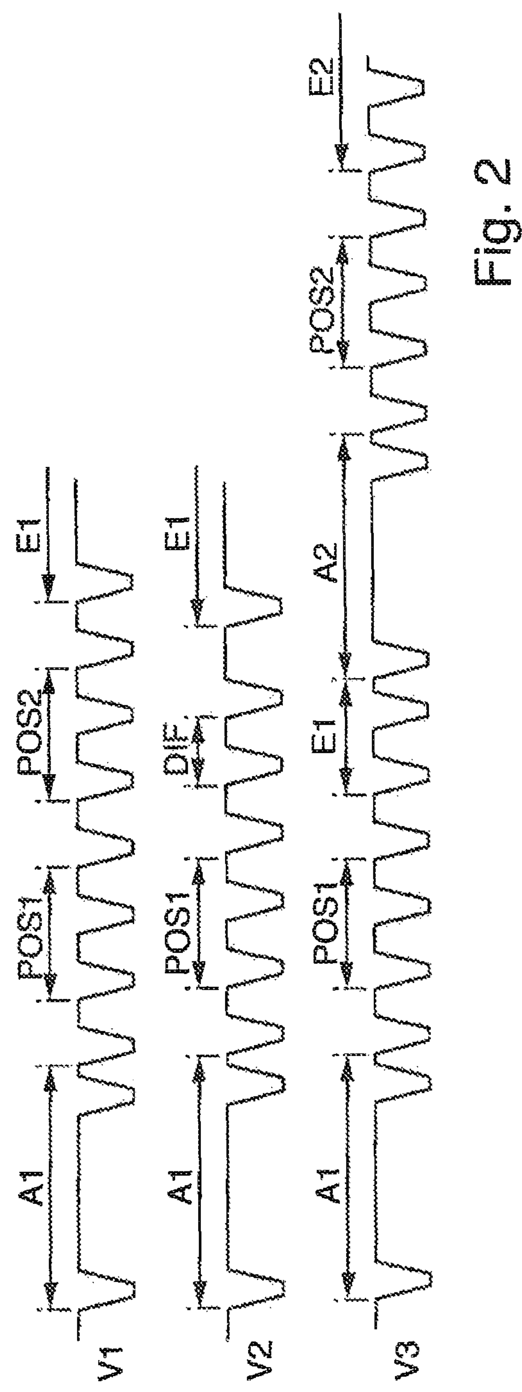
FIG. 2 shows multiple implementations of the method using the example of a SENT protocol.

The illustration in FIG. 2 shows a total of three different implementations of the method using the example of a SENT protocol. The three implementations comprise a first variant V1, a second variant V2, and a third variant V3. Excerpts of a SENT-compatible data protocol are represented for all three variants V1 to V3, with all variants V1 to V3 having a start region A1. Calibration sequences and other sequences are present in the start region A1. In all variants V1 to V3, a first data region POS1 is adjacent to the relevant start region A1. Sensor data, in the present case position data, are transmitted in the first data region POS1 by the first IC C1.

In the first variant V1, a second data region POS2 follows the first data region POS1. Sensor data, in the present case position data, are transmitted in the second data region POS2 by the second IC C2. This region is followed by a first end region E1.

In the second variant V2, a third data region DIF follows the first data region POS1. A deviation between the data detected by the first sensor and the data detected by the second sensor is transmitted in the third data region DIF by means of the second IC C2. This region is again followed by the first end region E1.

In the third variant V3, the first end region El immediately follows the first data region POS1. The first end region El is followed by an additional start region A2. The second data region POS2 follows the additional start region A2. Once again, sensor data, in the present case position data, are transmitted in the second data region POS2 by the second IC C2. This region is followed by a second end region E2.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for increasing a reliability of transducers having a first IC and a second IC, wherein the first and second IC have monolithically integrated circuit components each with one sensor and a signal contact designed for bidirectional data transmission, and a reference contact , and a supply voltage contact, the reference contact on the first and second IC being connected to or disconnected from the signal contact via a controllable switch, the method comprising:

- generating a signal as a function of a physical quantity sensed by the relevant sensor that is applied in each case to the signal contact, the first and second IC being integrated into a common IC package;
- connecting the supply voltage contact of the first IC to a first package contact, the first package contact being connected to a first terminal of a control unit;
- connecting the supply voltage contact of the second IC to a second package contact, the second package contact being connected to a second terminal of the control unit;
- connecting the reference contact of the first IC to a third package contact and to the reference contact of the second IC, the signal contact of the first IC is connected to the signal contact of the second IC and to a fourth package contact;
- transmitting the two signals through the fourth package contact to the control unit; and
- analyzing the two signals in the control unit.

2. The method for increasing the reliability according to claim 1, wherein the first and second IC are controlled as a function of the analysis.

3. The method for increasing the reliability according to claim 1, wherein in the first IC and in the second IC each signal is generated as a pulse-width modulated signal by an open-drain output.

4. The method for increasing the reliability according to claim 1, wherein the first IC is given priority over the second IC.

5. The method for increasing the reliability according to claim 1, wherein a deviation of the signal of the first IC from the signal of the second IC is indicated at the signal contact of the second IC.

6. The method for increasing the reliability according to claim 1, wherein only the signal of the second IC is output at the fourth package contact if the first IC is faulty.

7. The method for increasing the reliability according to claim 1, wherein the first and second IC are connected in a SENT configuration.

8. The method for increasing the reliability according to claim 7, wherein signals from the first IC are transmitted in a first part of the SENT protocol, and signals from the second IC are transmitted in a second part of the SENT protocol.

9. The method for increasing the reliability according to claim 7, wherein signals from the first IC are transmitted in a first part of the SENT protocol, and a deviation between the signals is transmitted with the signal in a second part of the SENT protocol by the second IC.

10. The method for increasing the reliability according to claim 8, wherein the second IC is triggered by the first IC, and the second IC transmits a SENT protocol signal of its own to the control unit.

11. The method for increasing the reliability according to claim 1, wherein Hall effect sensors are implemented in the two ICs, and the signals are generated as a function of the Hall voltage in the ICs.

12. The method for increasing the reliability according to claim 1, wherein the two ICs have the same circuit components.

* * * * *